(12) United States Patent
Johnson

(10) Patent No.: US 11,995,347 B2
(45) Date of Patent: *May 28, 2024

(54) APPARATUS WITH ACCESS CONTROL MECHANISM AND METHODS FOR OPERATING THE SAME

(71) Applicant: Micron Technology, Inc., Boise, ID (US)

(72) Inventor: Bret Johnson, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/545,220

(22) Filed: Dec. 8, 2021

(65) Prior Publication Data

US 2022/0100420 A1 Mar. 31, 2022

Related U.S. Application Data

(63) Continuation of application No. 17/038,612, filed on Sep. 30, 2020, now Pat. No. 11,226,767.

(51) Int. Cl.
*G11C 8/18* (2006.01)
*G06F 3/06* (2006.01)
*G11C 7/10* (2006.01)
*G11C 8/06* (2006.01)

(52) U.S. Cl.
CPC .......... *G06F 3/0656* (2013.01); *G11C 7/1057* (2013.01); *G11C 7/1063* (2013.01); *G11C 8/06* (2013.01); *G11C 8/18* (2013.01)

(58) Field of Classification Search
CPC ....... G06F 3/0656; G11C 8/06; G11C 7/1063; G11C 7/1057; G11C 8/18
USPC .................................................. 711/163, 167
See application file for complete search history.

(56) References Cited

U.S. PATENT DOCUMENTS

| | | | |
|---|---|---|---|
| 4,829,475 | A | 5/1989 | Ward et al. |
| 5,144,432 | A | 9/1992 | Higashitsutsumi |
| 5,309,567 | A | 5/1994 | Mizukami |
| 6,137,320 | A | 10/2000 | Takai |
| 6,172,935 | B1 | 1/2001 | Wright et al. |

(Continued)

FOREIGN PATENT DOCUMENTS

| | | | |
|---|---|---|---|
| KR | 20120019882 A | 3/2012 | |
| KR | 20170061275 A | 6/2017 | |
| WO | WO-2008076790 A2 * | 6/2008 | ............. G11C 11/40 |

OTHER PUBLICATIONS

Ranade, Ajinkya Prakash, Process and product design for vertically stacked high density memory modules, 2015, State University of New York at Binghamton. All pages. (Year: 2015).*

(Continued)

*Primary Examiner* — Michael T Tran
(74) *Attorney, Agent, or Firm* — Perkins Coie LLP

(57) ABSTRACT

Methods, apparatuses, and systems related to die-to-die communications are described. An apparatus may include an interfacing die and at least one additional die communicatively coupled to each other through an internal bus. The interfacing die may be configured to provide a combined external interface for the coupled dies. For the die-to-die communications, a target die may coordinate transfer of communicated data to the internal interface according to a timing signal generated by a source external to the at least one additional die.

19 Claims, 9 Drawing Sheets

(56) References Cited

U.S. PATENT DOCUMENTS

| | | |
|---|---|---|
| 6,498,537 B1 | 12/2002 | Watanabe |
| 6,813,211 B2 | 11/2004 | Takatsuka et al. |
| 7,447,110 B2 | 11/2008 | Chae |
| 7,464,225 B2 | 12/2008 | Tsern |
| 7,772,708 B2 | 8/2010 | Leddige et al. |
| 8,743,582 B2 | 6/2014 | Kang et al. |
| 10,229,900 B2 | 3/2019 | Kim et al. |
| 10,742,782 B2 | 8/2020 | Pope et al. |
| 10,928,886 B2 | 2/2021 | Mosalikanti et al. |
| 10,943,183 B2 | 3/2021 | Cha |
| 2009/0085608 A1 | 4/2009 | Alzheimer |
| 2010/0019377 A1* | 1/2010 | Arvelo ............... H01L 21/563 257/E23.101 |
| 2010/0074038 A1 | 3/2010 | Ruckerbauer et al. |
| 2010/0091537 A1* | 4/2010 | Best ............... G11C 11/4093 365/220 |
| 2011/0042798 A1* | 2/2011 | Pagaila ............... H01L 21/568 257/E21.705 |
| 2011/0090004 A1* | 4/2011 | Schuetz ............... G11C 29/808 327/564 |
| 2011/0148469 A1* | 6/2011 | Ito ............... G11C 5/04 361/820 |
| 2011/0156232 A1 | 6/2011 | Youn et al. |
| 2011/0291261 A1 | 12/2011 | Fleischman et al. |
| 2011/0309475 A1 | 12/2011 | Lee |
| 2012/0059984 A1* | 3/2012 | Kang ............... G11C 5/02 257/774 |
| 2013/0021866 A1 | 1/2013 | Lee |
| 2013/0042119 A1* | 2/2013 | Bennett ............... H04L 49/40 713/300 |
| 2013/0043584 A1 | 2/2013 | Kwon et al. |
| 2013/0103912 A1 | 4/2013 | Jones et al. |
| 2013/0148401 A1 | 6/2013 | Fai et al. |
| 2013/0336039 A1 | 12/2013 | Frans |
| 2014/0063887 A1 | 3/2014 | Vogelsang |
| 2014/0068344 A1 | 3/2014 | Miller |
| 2014/0104935 A1 | 4/2014 | Ware et al. |
| 2014/0192583 A1 | 7/2014 | Rajan et al. |
| 2014/0198584 A1* | 7/2014 | Norman ............... G11C 7/1078 365/189.05 |
| 2014/0217599 A1 | 8/2014 | Teh et al. |
| 2014/0264791 A1 | 9/2014 | Manusharow et al. |
| 2014/0268612 A1 | 9/2014 | Zhang et al. |
| 2014/0273431 A1 | 9/2014 | Sasagawa |
| 2014/0281773 A1 | 9/2014 | Goel et al. |
| 2014/0376295 A1 | 12/2014 | Oh et al. |
| 2015/0046612 A1* | 2/2015 | Gupta ............... G06F 13/4018 710/105 |
| 2015/0193158 A1* | 7/2015 | Yoon ............... G06F 11/108 711/105 |
| 2015/0302904 A1* | 10/2015 | Yoon ............... G11C 5/04 711/147 |
| 2015/0380090 A1* | 12/2015 | Park ............... G11C 16/349 365/185.13 |
| 2016/0202910 A1 | 7/2016 | Ravimohan et al. |
| 2017/0125119 A1* | 5/2017 | Loh ............... G11C 29/1201 |
| 2017/0162238 A1* | 6/2017 | Lee ............... G11C 29/021 |
| 2017/0194039 A1* | 7/2017 | Funaki ............... G11C 29/028 |
| 2017/0255552 A1* | 9/2017 | Chatterjee ............ G11C 11/4096 |
| 2019/0066816 A1* | 2/2019 | Dono ............... G01R 31/31716 |
| 2019/0304512 A1* | 10/2019 | Narui ............... G11C 7/1066 |
| 2019/0333550 A1 | 10/2019 | Fisch |
| 2020/0013756 A1* | 1/2020 | Pon ............... H01L 23/3107 |
| 2020/0074202 A1 | 3/2020 | Kim et al. |
| 2020/0151053 A1* | 5/2020 | Cha ............... G06F 11/1044 |
| 2020/0174952 A1* | 6/2020 | Lee ............... G06F 15/167 |
| 2020/0227130 A1* | 7/2020 | Kim ............... G11C 7/222 |
| 2020/0303344 A1* | 9/2020 | Manipatruni ............ H01L 24/73 |
| 2020/0335479 A1* | 10/2020 | Li ............... H01L 21/6836 |
| 2020/0371157 A1* | 11/2020 | Choi ............... G11C 29/006 |
| 2021/0149834 A1 | 5/2021 | Fletcher et al. |
| 2021/0193245 A1* | 6/2021 | Ryu ............... G11C 7/1057 |
| 2021/0263671 A1* | 8/2021 | O ............... G06F 3/0655 |

OTHER PUBLICATIONS

International Search Report and Written Opinion dated Jan. 13, 2022 for International Patent Application No. PCT/US2021/051668, 9 pages.

* cited by examiner

APPARATUS WITH ACCESS CONTROL MECHANISM AND METHODS FOR OPERATING THE SAME

CROSS-REFERENCE TO RELATED APPLICATION

This application is a continuation of U.S. patent application Ser. No. 17/038,612, filed on Sep. 30, 2020, now U.S. Pat. No. 11,226,767, which is incorporated by reference herein in its entirety.

TECHNICAL FIELD

The disclosed embodiments relate to devices, and, in particular, to semiconductor memory devices with access control mechanisms and methods for operating the same.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), utilize electro-magnetic energy to store and access data.

Technological improvements are often associated with decreasing the size/footprint of the apparatus and/or circuits therein. Accordingly, the apparatus can include denser circuits and/or stacked semiconductor devices. However, decreasing the size/footprint and/or stacking semiconductor devices present new or additional challenges. For example, some memory devices operate with relatively short durations for signal transitions. As processing speeds increase, these transition windows become shorter. In contrast, as the density of the circuits increase, separations between signal connections (e.g., wires, traces, contacts, etc.) decrease, which increase capacitances and/or inductances between connections and/or corresponding circuits that delay or prolong the transitions between signal levels. Further, propagation delays are introduced or increased for signals communicated between dies due to the relatively long signal paths. Different amounts of propagation delays are introduced to signals traveling different lengths to reach different dies within the stack. As such, signal timings must account for the varying propagation delays, which often prevent any reductions in the signal transition windows.

DETAILED DESCRIPTION

Figure 1:
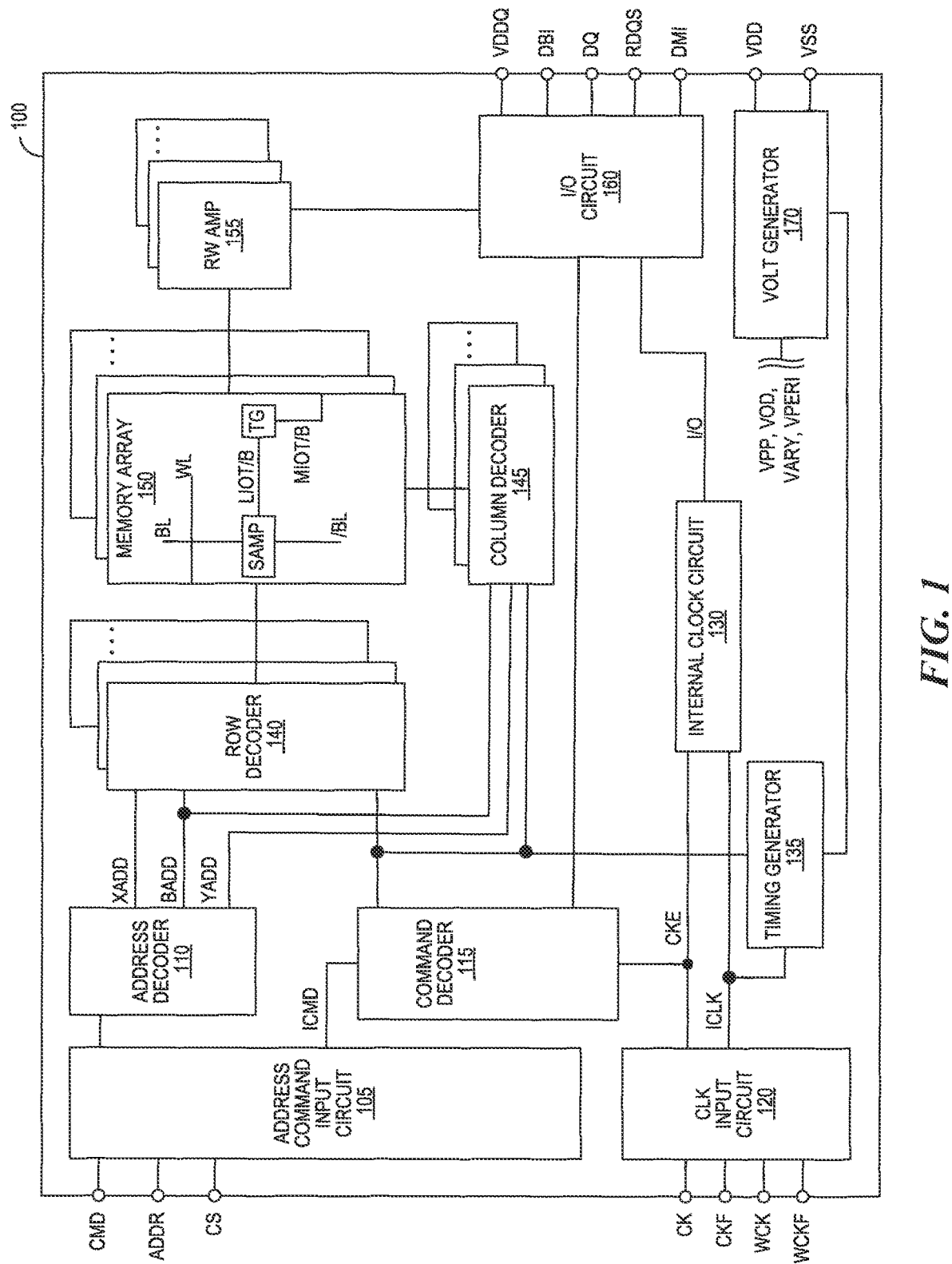
FIG. 1 is a block diagram of an apparatus in accordance with an embodiment of the present technology.

As described in greater detail below, the technology disclosed herein relates to an apparatus, such as for memory systems, systems with memory devices, related methods, etc., for controlling access to signals. The apparatus (e.g., a memory device and/or a system including the memory device) can include a die stack that includes a master die along with a set of slave dies. The master die can function as an interface to an external device (e.g., a host device) such that the external device views the die stack as a single device (i.e., without seeing the individual dies). Accordingly, the master die can include an interface circuit (e.g., a combination of an externally-oriented circuitry and an internally-oriented circuitry) that processes and/or translates operations and/or information across external and internal formats. For example, the host device can issue a read command for accessing a read address. The master die can translate the read address to a target die and/or a location therein. The master die can provide the necessary information to the target die and/or coordinate information communicated with the particular die for external access.

The interface circuit in the master die and a corresponding interface circuit in each of the slave dies can be configured to communicate payload data (e.g., data read from a memory array on the corresponding die) and/or timing information (e.g., read strobe signals) via corresponding buses that include die-external connectors (e.g., wirebonds, Through-Silicon-Vias (TSVs), die-to-die connectors, solder, etc.). For example, the slave dies can each a slave access bus (e.g., read data line that provides read data from the memory array) to the stack-external connectors. The master die can similarly connect a master access bus to the stack-external connectors. The master die can include a traffic control circuit that accesses the payload data and the timing information on the die-external connectors. According to the timing information, the traffic control circuit can provide the payload information to subsequent circuitry (e.g., a buffer, such as a First-In First-Out (FIFO) buffer), a serializer, an external Input/Output (I/O) controller, and/or a pad or a connector) for external communication. In one or more embodiments, the slave dies can include the traffic control circuit and/or the subsequent external communication circuitry that have been disabled.

In some embodiments, the apparatus can additionally include a coordination buffer and an internal-bus access circuit in the master die and/or the slave dies. For example, the coordination buffer can include the coordination buffer connected between the memory array and the die-external connectors. The internal-bus access circuit can be connected between the coordination buffer and the coordination buffer. The internal-bus access circuit and/or the coordination buffer can be controlled a common die-external signal (e.g., a clock signal, such as a strobe signal) that is commonly provided to all dies in the stack. For example, the coordination buffer and the internal-bus access circuit can be controlled according to a read strobe signal provided by the master die to the slave dies in parallel. The read strobe signal can travel a relatively shorter path due to a lack of processing circuitry in comparison to other data-related paths. The slave dies can generate an internal timing signal based on the read strobe signal and control the coordination buffer and the internal-bus access circuit therein. Accordingly, the read data can be temporarily stored in the coordination buffer and communicated onto the die-external connectors using the read strobe signal.

Using the common die-external signal to coordinate data communicated between dies provides increased tolerance to Process, Voltage, and Temperature (PVT) variations for the apparatus and increase accuracy for signal timings/transitions. Moreover, the coordination buffer and the internal-bus access circuit allow for longer die-external paths, which translate to an increase in the number of dies within the stack (e.g., more than four dies) and thereby increasing the circuit density for a given footprint.

FIG. 1 is a block diagram of an apparatus 100 (e.g., a semiconductor die assembly, including a three-dimensional integration (3DI) device or a die-stacked package) in accordance with an embodiment of the present technology. For example, the apparatus 100 can include a DRAM or a portion thereof that includes one or more dies/chips.

The apparatus 100 may include an array of memory cells, such as memory array 150. The memory array 150 may include a plurality of banks (e.g., banks 0-15), and each bank may include a plurality of word-lines (WL), a plurality of bit lines (BL), and a plurality of memory cells arranged at intersections of the word-lines and the bit lines. Memory cells can include any one of a number of different memory media types, including capacitive, magnetoresistive, ferroelectric, phase change, or the like. The selection of a word-line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The sense amplifiers and transfer gates may be operated based on control signals from decoder circuitry, which may include the command decoder 115, the row decoders 140, the column decoders 145, any control circuitry of the memory array 150, or any combination thereof. The memory array 150 may also include plate lines and corresponding circuitry for managing their operation.

The apparatus 100 may employ a plurality of external terminals that include command and address terminals coupled to a command bus and an address bus to receive command signals (CMD) and address signals (ADDR), respectively. The apparatus 100 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 1) from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal and supply the bank address signal to both the row decoder 140 and the column decoder 145.

The command and address terminals may be supplied with command signals (CMD), address signals (ADDR), and chip select signals (CS), from a memory controller. The command signals may represent various memory commands from the memory controller (e.g., including access commands, which can include read commands and write commands). The chip select signal may be used to select the apparatus 100 to respond to commands and addresses provided to the command and address terminals. When an active chip select signal is provided to the apparatus 100, the commands and addresses can be decoded, and memory operations can be performed. The command signals may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word-line and a column command signal to select a bit line. The command decoder 115 may further include one or more registers for tracking various counts or values (e.g., counts of refresh commands received by the apparatus 100 or self-refresh operations performed by the apparatus 100).

Read data can be read from memory cells in the memory array 150 designated by row address (e.g., address provided with an active command) and column address (e.g., address provided with the read). The read command may be received by the command decoder 115, which can provide internal commands to input/output (I/O) circuit 160 so that read data can be output from the data terminals DQ, RDQS, DBI, and DMI via read/write amplifiers 155 and the I/O circuit 160 according to the RDQS clock signals. The read data may be provided at a time defined by read latency information RL that can be programmed in the apparatus 100, for example, in a mode register (not shown in FIG. 1). The read latency information RL can be defined in terms of clock cycles of the CK clock signal. For example, the read latency information RL can be a number of clock cycles of the CK signal after the read command is received by the apparatus 100 when the associated read data is provided.

Write data can be supplied to the data terminals DQ, DBI, and DMI according to the WCK and WCKF clock signals. The write command may be received by the command decoder 115, which can provide internal commands to the I/O circuit 160 so that the write data can be received by data receivers in the I/O circuit 160 and supplied via the I/O circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the apparatus 100, for example, in the mode register. The write latency WL information can be defined in terms of clock cycles of the CK clock signal. For example, the write latency information WL can be a number of clock cycles of the CK signal after the write command is received by the apparatus 100 when the associated write data is received.

The power supply terminals may be supplied with power supply potentials $V_{DD}$ and $V_{SS}$. These power supply potentials $V_{DD}$ and $V_{SS}$ can be supplied to an internal voltage generator circuit 170. The internal voltage generator circuit 170 can generate various internal potentials $V_{PP}$, $V_{OD}$, $V_{ARY}$, $V_{PERI}$, and the like based on the power supply potentials $V_{DD}$ and $V_{SS}$. The internal potential $V_{PP}$ can be used in the row decoder 140, the internal potentials $V_{OD}$ and $V_{ARY}$ can be used in the sense amplifiers included in the memory array 150, and the internal potential $V_{PERI}$ can be used in many other circuit blocks.

The power supply terminal may also be supplied with power supply potential $V_{DDQ}$. The power supply potential $V_{DDQ}$ can be supplied to the I/O circuit 160 together with the power supply potential VSS. The power supply potential $V_{DDQ}$ can be the same potential as the power supply potential $V_{SS}$ in an embodiment of the present technology. The power supply potential $V_{DDQ}$ can be a different potential from the power supply potential $V_{DD}$ in another embodiment of the present technology. However, the dedicated power supply potential $V_{DDQ}$ can be used for the I/O circuit 160 so that power supply noise generated by the I/O circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a clock/enable signal from the command decoder 115, an input buffer can receive the clock/enable signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable (not shown in FIG. 1) from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide I/O clock signals. The I/O clock signals can be supplied to the input/output circuit 160 and can be used as timing signals for determining output timing of read data and/or input timing of write data. The I/O clock signals can be provided at multiple clock frequencies so that data can be output from and input to the apparatus 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The apparatus 100 can be connected to any one of a number of electronic devices capable of utilizing memory for the temporary or persistent storage of information, or a component thereof. For example, a host device of apparatus 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 100; although in other embodiments, the host device may be indirectly connected to memory device (e.g., over a networked connection or through intermediary devices).

Figure 2:
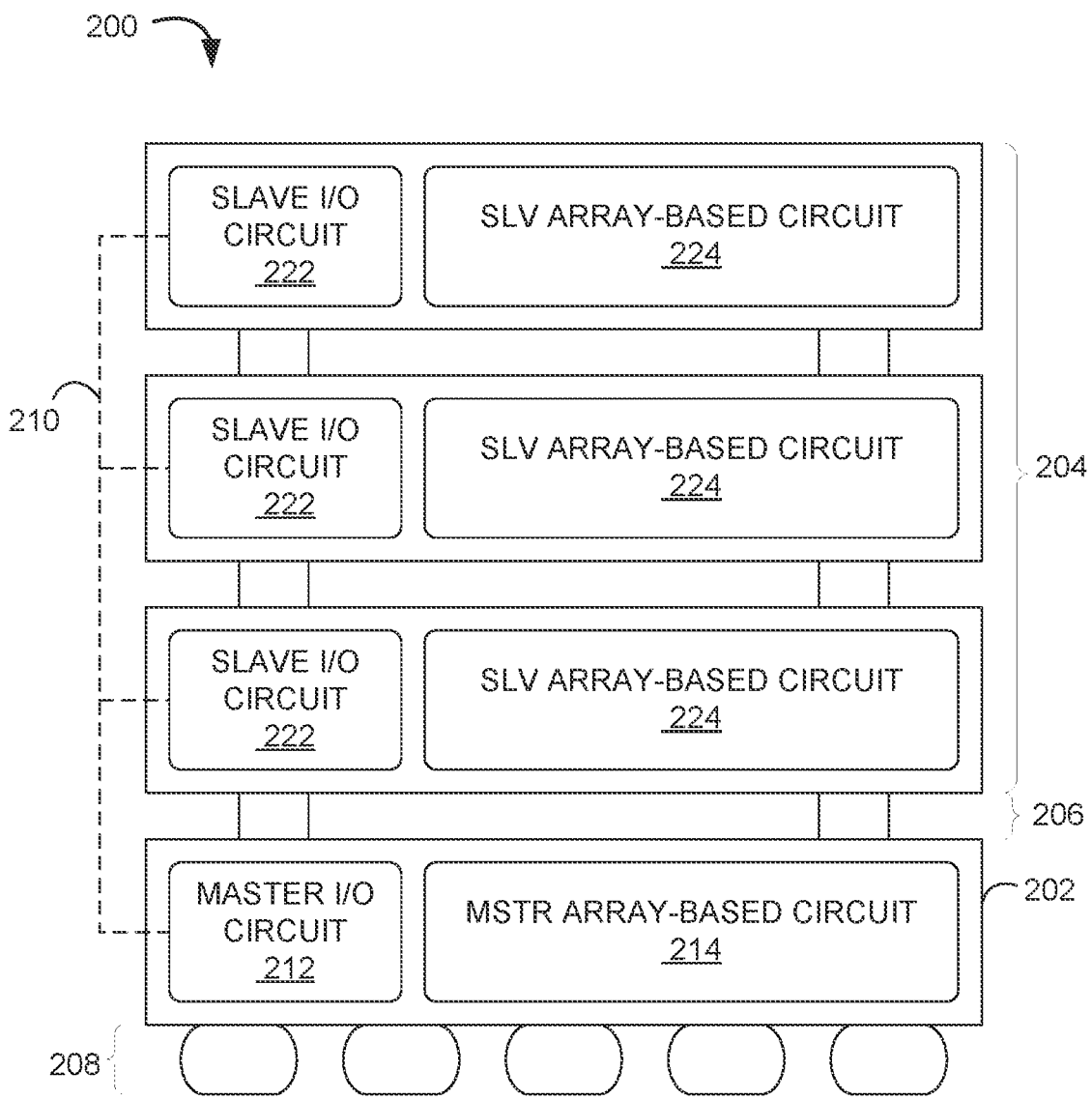
FIG. 2 is a schematic diagram of a die stack in accordance with an embodiment of the present technology.

FIG. 2 is a schematic diagram of a die stack 200 in accordance with an embodiment of the present technology. The apparatus 100 can include one or more instances of the die stack 200. The die stack 200 can include a master die 202 with one or more slave dies 204 stacked or attached on top of each other. The stacked dies can be electrically coupled to each other through die-external connectors 206, such as metallic columns, solder, and/or wire bonds. The die-external connectors 206 can contact and/or be coupled to electrical connectors on the dies, such as traces, pads, TSVs, wires, and/or circuit elements (e.g., passive devices and/or transistor devices). The die stack 200 can include a set of stack-external connectors 208 (e.g., pads, solder bumps, and/or other connectors) configured to electrically couple the die stack 200 to an external device, circuit, and/or structure. The stack-external connectors 208 can be directly attached to or integral with the master die 202.

One or more of the die-external connectors 206 can be included in and/or facilitate a stack-internal bus 210 that connects the dies within the stack 200 to each other. The stack-internal bus 210 can include a set of electrical connections (represented using dashed lines in FIG. 2) that couple the dies in parallel. The stack-internal bus 210 can be used to communicate various types of information (via, e.g., dedicated connections and/or shared-multiplexed connections), such as data, timing/strobe signals, clock signals, command signals, etc. Some examples of the information communicated over the stack-internal bus 210 can include read or write data, strobes, and/or clocks.

Each of the dies can include data storage circuits and interface circuits. For example, the master die 202 can include a master interface (e.g., I/O) circuit 212 and the master array-based circuit 214. Each of the slave dies 204 can include a slave interface (I/O) circuit 222 and a slave array-based circuit 224.

The master I/O circuit 212 can include circuitry configured to communicate information with the external device (e.g., a host device or a controller) and the slave dies 204. For example, the master I/O circuit 212 can include internal and external connections (e.g. pads) that are connected to the die-external connectors 206 and stack-external connectors 208, respectively. The master I/O circuit 212 can include circuitry configured to translate (via, e.g., a look up table) between externally-used addresses (e.g., addresses used by the host device to identify locations within the die stack) and internally-used addresses (e.g., addresses to identify targeted dies and/or locations within the targeted dies). In other words, the external devices can essentially view (via, e.g., the externally used addressing mechanism) the die stack 200 as a single device without distinguishing between the individual dies therein. The master I/O circuit 212 can be configured to route the data to/from the dies within the die stack 200 according to the translation.

As an illustrative example, the master I/O circuit 212 can include at least a portion of the address command input circuit 105 of FIG. 1 and be configured to receive a physical address along with a read command from the host device. The master I/O circuit 212 can be configured to identify a die, a channel, a bank, etc. based on the physical address. The master I/O circuit 212 can include circuitry communicate the read command and the translated storage location accordingly. The master I/O circuit 212 can further include at least a portion of the I/O circuit 160 of FIG. 1 and the corresponding pads configured to receive the read data from the storage locations and communicate the read data out to the host device. The master I/O circuit 212 can include one or more portions of other circuits illustrated in FIG. 1, such as the clock input circuit 120, the timing generator 135, the internal clock circuit 130, etc.

When the die targeted by the commanded/scheduled operation is the master die 202, the master die can access the corresponding location in the master array-based circuit 214. The master array-based circuit 214 can include local memory cells (e.g., a portion of the memory array 150 of FIG. 1) configured to store data on the master die 202. The master array-based circuit 214 can further include array-related circuitry (e.g., a portion of the row/column decoders, the read/write amplifiers 155, etc. illustrated in FIG. 1) configured to store data into and read data from the local memory cells.

When the die targeted by the commanded/scheduled operation is a slave die, the master I/O circuit 212 can communicate the command and/or the location to the slave I/O circuit 222 of the targeted slave die. The slave I/O circuit 222 can include circuitry configured to communicate information with the master die 202. The slave I/O circuit 222 can communicate to the external device through the master I/O circuit 212 (i.e., without a direct access to the external device). For example, the slave I/O circuit 222 can include internal connections (e.g. pads) that are connected to the die-external connectors 206. The slave I/O circuit 222 can include circuitry configured to access locally stored data. The slave I/O circuit 222 can correspond to internal electrical connections (e.g., connections between circuits), a portion of the address command input circuit 105, a portion of the I/O circuit 160, and/or other circuits shown in FIG. 1.

The slave array-based circuit 224 can be similar to the master array-based circuit 214. For example, the slave array-based circuit 224 can include local memory cells (e.g., a portion of the memory array 150) configured to store data on the corresponding slave die. The slave array-based circuit 224 can further include array-related circuitry (e.g., a portion of the row/column decoders, the read/write amplifiers 155, etc. illustrated in FIG. 1) configured to store data into and read data from the local memory cells.

The die stack 200 can include the circuitry illustrated in FIG. 1 distributed over the master die 202 and the slave dies 204. In some embodiments, the master die 202 and the slave dies 204 can include identical circuitry/designs that are activated or enabled according to the master/slave roles. For example, the slave dies 204 can include externally-facing communication circuitry and/or the translation circuitry that have been disabled. Alternatively, the master die 202 can include a different circuitry/design than the slave dies 204.

Figure 3A:
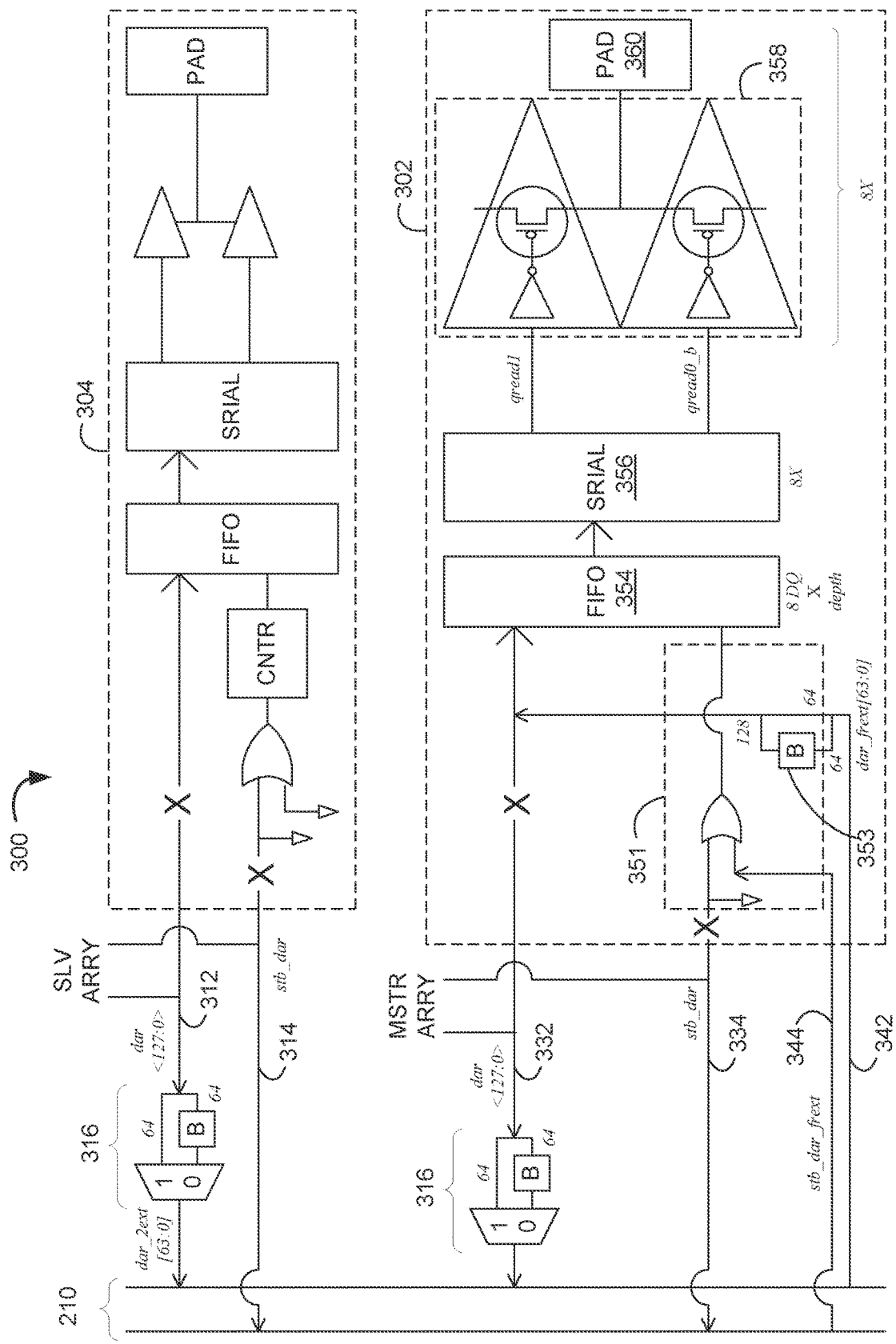
FIG. 3A is a first access control circuit in accordance with an embodiment of the present technology.

FIG. 3A is a first access control circuit 300 in accordance with an embodiment of the present technology. The first access control circuit 300 can correspond to one or more portions of the master I/O circuit 212 of FIG. 2 and the slave I/O circuit 222 of FIG. 2. For illustrative purposes, an upper portion of FIG. 3A illustrates a portion of the slave I/O circuit 222 on one of the slave dies 204 of FIG. 2, and a lower portion of FIG. 3A illustrates a portion of the master I/O circuit 212 on the master die 202 of FIG. 2. For brevity, embodiments of the present technology, including the circuitry illustrated in FIG. 3A, are described below with respect to read operations. However, it is understood that various aspects of the described embodiments can be applied to circuits corresponding to other operations (e.g., write operations).

The first access control circuit 300 can be configured to control communication of storage content. For example, the first access control circuit 300 can be configured to control communication of read data between dies within the die stack 200 and between the die stack 200 and an external device. The first access control circuit 300 can include an I/O control circuit for each die. For example, the master die 202 can include a master I/O control circuit 302, and each of the slave dies can include a slave I/O control circuit 304. In some embodiments, the master I/O control circuit 302 and the slave I/O control circuit 304 can include identical circuits/design. The master I/O control circuit 302 and the slave I/O control circuit 304 can be configured to communicate information with an external device. Accordingly, the master I/O control circuit 302 can be configured to communicate with the external device for the die stack 200.

The slave I/O control circuit 304 can be disabled. The slave dies 204 can be configured to communicate the data to/from the local memory cells through stack-internal connections, such as the die-external connectors 206. For example, the slave dies 204 can each include a slave access bus 312 (e.g., read data line, "dar<127:0>") configured to communicate data to/from the memory array within the corresponding slave die. Also, the slave dies 204 can each include a slave timing connection 314 (e.g., read strobe, "stb_dar") configured to providing timing information for communicating the data over the slave access bus 312. As an illustrative example, data read from a local memory array can be communicated through the slave access bus 312 according to the read strobe over the slave timing connection 314. Since the slave I/O control circuit 304 is disabled, it can be electrically disconnected from the slave access bus 312 and the slave timing connection 314. Instead, the slave access bus 312 can be electrically coupled to the stack-internal bus 210 and the master die 202. Similarly, the slave access bus 312 can be electrically coupled to the stack-internal bus 210 and the master die 202.

In some embodiments, the dies can each include a bus controller 316 between the access bus (e.g., the slave access bus) and the die-external connectors 206. The bus controller 316 can be configured to adjust the format of the data communicated over the die-external connectors 206, such as for reducing the utilized quantity of the die-external connectors 206. For example, the bus controller 316 can be configured to reduce the amount of read data communicated over the stack-internal bus 210 at one time. Accordingly, the bus controller 316 can provide reduced number of pads, connectors, and/or other circuitry components associated with the communicated data, thereby reducing the footprint of the circuits and the dies.

In some embodiments, the bus controller 316 can include one or more buffers and a multiplexer. The multiplexer can allow a first portion of the read data to pass through to the stack-internal bus 210 while the one or more buffers store remaining portion(s) of the read data. Subsequent to the first portion, the buffers and the multiplexer can allow the temporarily stored read data from the buffers to pass to the die-external connectors 206. When the slave access bus is configured to provide 'x' bits, the bus controller 316 can be configured to divide the 'x' bits into 'n' groups each including 'x/n' bits or less. The bus controller 316 can put 'x/n' bits onto the stack-internal bus 210 'n' number of times to communicate the read data. For the example illustrated in FIG. 3A, the read data can include 128 bits, and the bus controller 316 can divide the read data into two 64-bit groupings. The multiplexer can allow the first set of 64 bits to pass to the stack-internal bus 210 while the buffer temporarily stores the remaining group of 64 bits. The stored 64 bits can be communicated after the first set of 64 bits.

For consistency, the master die 202 can similarly route the communicated data through the die-external connectors 206. Accordingly, all of the data communicated to/from local memory arrays can be communicated through a common path, even when the targeted memory array is on the master die 202. For example, the master die 202 can include a master access bus 332 (e.g., read data line, "dar<127:0>") configured to communicate data to/from the memory array within the master die 202. In some embodiments, the master die 202 can include an instance of the bus controller 316 between the master access bus 332 and the corresponding die-external connectors 206. Also, the master die 202 can include a master timing connection 334 (e.g., read strobe, "stb_dar") configured to providing timing information for communicating the data over the master access bus 332. The master access bus 332 and the slave timing connection 314 can be electrically disconnected from the master I/O control circuit 302. Instead, the master access bus 332 and the master timing connection 334 can be electrically coupled to the corresponding die-external connectors 206. Accordingly, the stack-internal bus 210 can couple the dies and/or the internal memory arrays in parallel.

The master die 202 can include active/enabled external communication circuit. For example, the master die 202 can include a shared access bus 342 and a shared timing connection 344 electrically connected to the die-external connectors 206. The shared access bus 342 can be electrically coupled to and provide a common path for the slave access bus 312 and the master access bus 332. For example, the shared access bus 342 can provide a shared circuitry/path for the dies within the die stack 200 to communicate the read data (dar <127:0>) to/from an external device. Similarly, the shared timing connection 344 can provide a shared circuitry/path for the dies within the die stack 200 to communicate the read strobe (stb_dar) used to coordinate communication of the read data. The read strobe can be a timing signal indicating when the data bus (e.g., the shared access bus 342 and/or the data buses local to the dies) transitions and is valid. In other words, the read strobe can match the timing of the read data. The read strobe can be in an array time domain (e.g., coordinated with the memory arrays internal to the die).

The external communication circuit can further include the master I/O control circuit 302 electrically coupled to the shared access bus 342 and the shared timing connection 344. For example, the external communication circuit and/or the master I/O control circuit 302 can include a traffic control circuit 351 configured to access the information from the die-external connectors 206. In some embodiments, the traffic control circuit 351 can include a strobe control circuit (e.g., an OR gate) coupled to the shared timing connection 344 and configured to receive/drive the corresponding timing/strobe signal. The strobe control circuit can provide the corresponding timing signals to an I/O control buffer, such as a FIFO buffer 354 that accesses/provides the communicated data according to the timing signals. For example, the FIFO buffer 354 can receive the read data from the stack-internal bus 210 and provide the read data to subsequent circuitry according to the read strobe signal.

In some embodiments, the traffic control circuit 351 can include a buffer 353 between the FIFO buffer 354 and the die-external connectors 206. The buffer 353 and the routing controller 352 can correspond to the bus controller 316. Accordingly, the buffer 353 can be configured to store a first-communicated portion of the communicated data (e.g., the first 64 bits of the read data). In some embodiments, the FIFO buffer 354 can include a set of latches and/or a sampling circuitry configured to asynchronously receive portions (e.g., different bits at different times) of the communicated data. The FIFO buffer 354 can identify a set of received data as a single grouping such as the originally communicated grouping of read data, according to the timing signal. In some example embodiments, the FIFO buffer 354 can have a capacity that corresponds to a set number of DQ pads (e.g., eight) and a buffer depth (e.g., $d_1$).

The FIFO buffer 354 can pass the communicated data (e.g., the combined 128 bits of the read data) to a serializer 356. The serializer 356 can be configured to adjust the format of the communicated data, such as from a parallel arrangement to a serial arrangement. The serializer 356 can generate the rearranged output (e.g., "qread1" and/or "qread0_b") used to drive an external I/O controller 358 (e.g., a driver). In other words, the FIFO buffer 354 can temporarily store the parallel set of bits while the serializer 356 serially outputs a set of the parallel bits. The depth of the FIFO buffer 354 can correspond to the number of parallel bit sets (e.g., separate/subsequent read data) that can be stored therein. Accordingly, the read data can be communicated as a continuous output stream based on the FIFO buffer 354 and the serializer 356. The external I/O controller 358 can communicate (e.g., transmit) the continuous stream of data to or through a corresponding pad 360 (e.g., a DQ pad). In some embodiments, the master I/O control circuit 302 can be configured to communicate through eight pads and include the external I/O controller 358, the serializer 356, and/or the FIFO buffer 354 configured to communicate through the eight data pads.

Figure 3B:
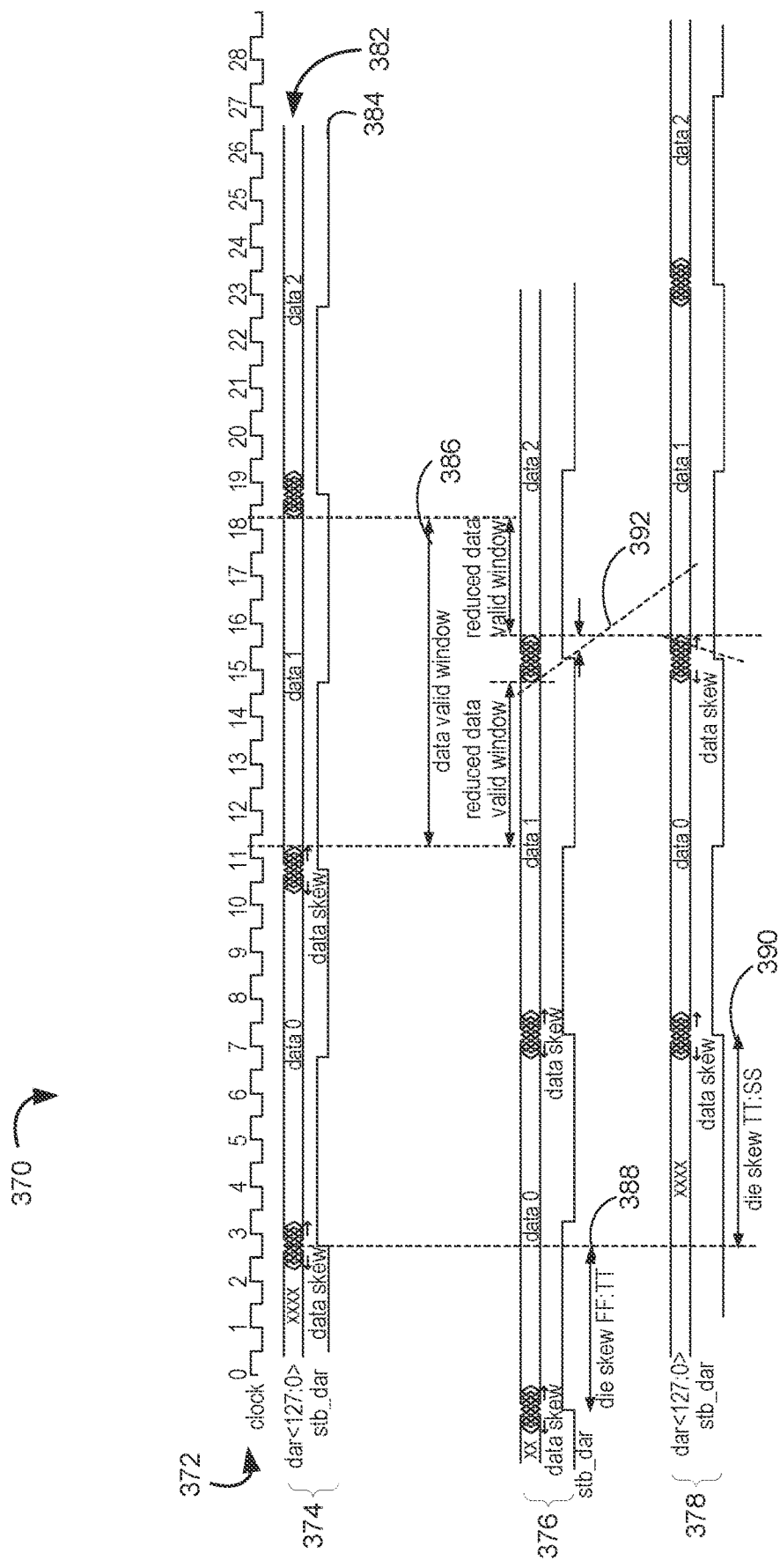
FIG. 3B is a timing diagram describing example operational states of the first access control circuit in accordance with an embodiment of the present technology.

FIG. 3B is a timing diagram describing example operational states of the first access control circuit in accordance with an embodiment of the present technology. FIG. 3B illustrates possible timing variations between dies. Timing variations can be cause by, for example, PVT variations.

The dies within the die stack 200 can operate according to a clock signal 372. The clock signal 372 can be broadcasted (e.g., from the master die 202 of FIG. 2) to the dies within the die stack 200. The clock signal 372 can be used to synchronize the dies and/or control timing of operations for each die.

FIG. 3B illustrates a reference die timing 374, a fast die timing 376, and a slow die timing 378 fora given set of read operations. The set of read operations can produce a read output 382 ("dar <127:0>") that is coordinated by an internal read strobe 384 ("stb_dar") as illustrated in each of the timings 374-378. As described above, the read output 382 can be accessed from the die-internal memory array and provided on the access bus (e.g., the slave access bus 312 of FIG. 3A or the master access bus 332 of FIG. 3A), and the internal read strobe 384 can be provided on the timing connection (e.g., the slave timing connection 314 of FIG. 3A or the master timing connection 334 of FIG. 3A).

The reference die timing 374 can represent a read output timing for an average-speed die. As a reference, an average die may respond to a read command and produce 'data 0' at the beginning of clock cycle '3'. Accordingly, the corresponding internal read strobe 384 can transition high and remain high until a half way point (e.g., beginning of clock cycle '7') in a data valid window 386 and transition low afterward. Data skews or timing variations are represented using hash marks at the beginning/end of each read output data.

In comparison to an average die, a fast die can output the read data at an earlier time (e.g., at the beginning of clock cycle '0') as represented by the fast die timing 376. Accordingly, the fast die can have a forward skew 388 corresponding to the earlier output of the read data in comparison to the average die. A slow die can output the read data at a later time (e.g., at the beginning of clock cycle '7') as represented by the slow die timing 378. Accordingly, the slow die can have a backward skew 390 corresponding to the later output of the read data in comparison to the average die.

As illustrated using the data valid window 386 for 'data 1', the forward skew 388 and the backward skew 390 each cause a reduced overlap between the corresponding output window and the average output window. Since the fast die doesn't know to wait for the slow die, the data access window overlap and the dies can clobber each other, such as for a synchronously triggered cache read out that starts on a specific common clock count after a read command. Moreover, for the example illustrated in FIG. 3B, the forward skew 388 and the backward skew 390 are such that no valid overlaps exist across the fast die and the slow die. The variations between dies are further complicated by a transport delay 392 that corresponds to a distance between the corresponding die and the master die 202.

From the perspective of the master die 202, it is desirable to reduce the delays or make the delays predictable. In other words, the master die 202 should be able to access the memory arrays in the slave dies 204 as if they were within the master die 202. Conventional memory devices use a predetermined delay (via, e.g., programmable delay cells) to manage such variations for coordinating stack-internal or die-to-die communication. However, it becomes increasingly difficult to compensate die skews with programmable delay cells as the internal skew (e.g., PVT variations) and the external skew (e.g., the transport delay 392) grow. The delay may not track actual skews. Further delay cells will grow in size and consume more power.

Figure 4A:
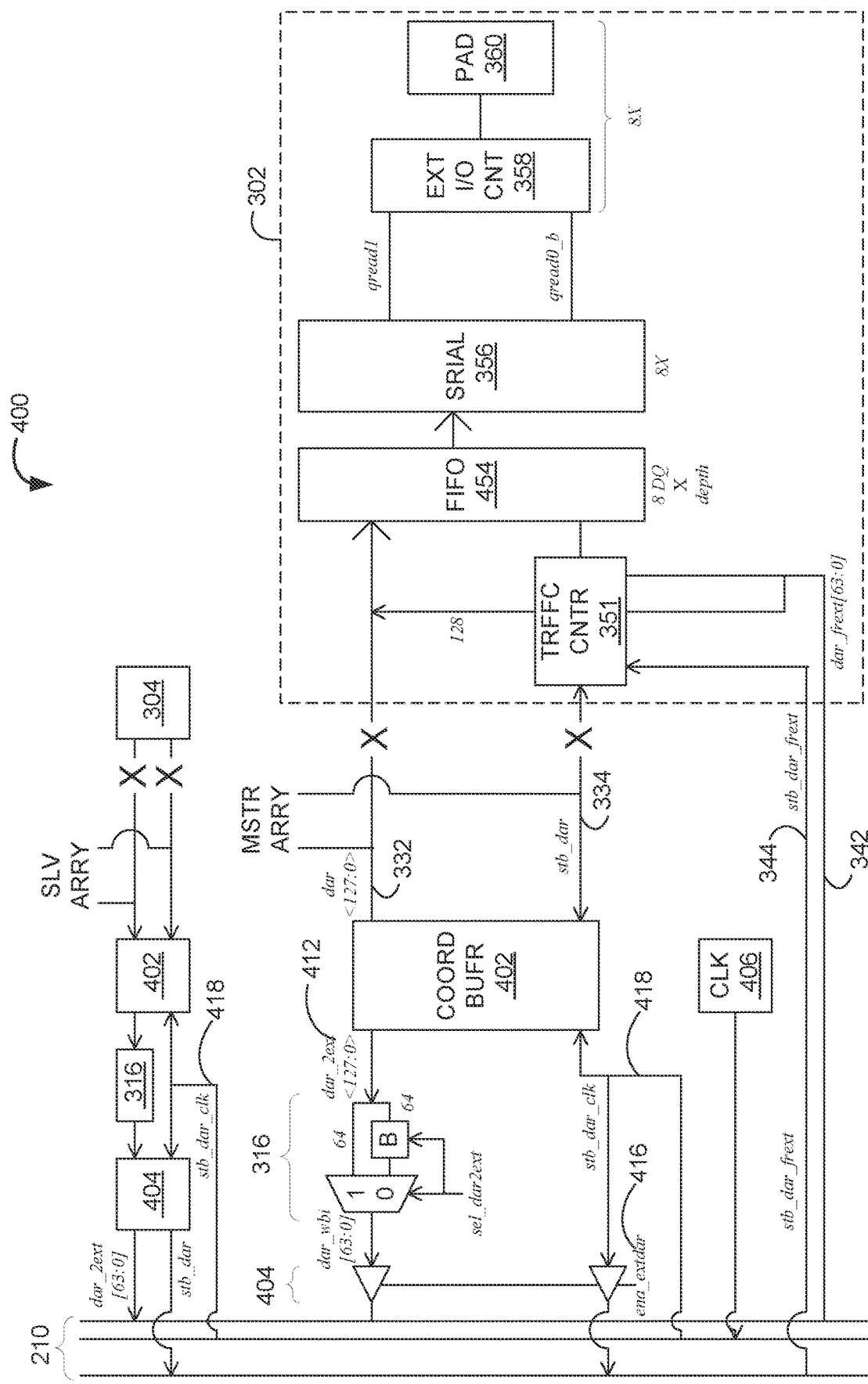
FIG. 4A is a second access control circuit in accordance with an embodiment of the present technology.

FIG. 4A is a second access control circuit 400 in accordance with an embodiment of the present technology. The second access control circuit 400 can use the clock signal 372 of FIG. 3B to coordinate operations across the different dies. In other words, the second access control circuit 400 can manage the timing variations without a predetermined delay module.

The second access control circuit 400 can correspond to one or more portions of the master I/O circuit 212 of FIG. 2 and the slave I/O circuit 222 of FIG. 2. For illustrative purposes, an upper portion of FIG. 4A illustrates a portion of the slave I/O circuit 222 on one of the slave dies 204 of FIG. 2, and a lower portion of FIG. 4A illustrates a portion of the master I/O circuit 212 on the master die 202 of FIG. 2.

The second access control circuit 400 can be configured to control communication of storage content. For example, the second access control circuit 400 can be configured to control communication of read data between dies within the die stack 200 and between the die stack 200 and an external device. The second access control circuit 400 can include an I/O control circuit for each die. The second access control circuit 400 and the first access control circuit 300 of FIG. 3A can include common/matching circuitry. For example, the second access control circuit 400 can include the master I/O control circuit 302, the slave I/O control circuit 304, the traffic control circuit 351, and/or the bus controller 316.

The second access control circuit 400 can include a coordination buffer 402 in each of the dies in the die stack 200 of FIG. 2. The coordination buffer 402 can be between the local memory arrays and the die-external connectors 206. The coordination buffer 402 can be electrically coupled (via, e.g., a direct connection) to the corresponding data access buses (e.g., the slave access bus 312 of FIG. 3A, the master access bus 332, etc.). The coordination buffer 402 can also be electrically coupled to the local timing signal (e.g., the read strobe signal, "stb_dar"). The coordination buffer 402 can be configured to temporarily store and group/align data into units. In some embodiments, the coordination buffer 402 can be implemented as a FIFO buffer. The coordination buffer 402 can have a depth ($d_2$) that is different than (e.g., greater or lesser) the depth of the FIFO buffer 354 of FIG. 3A. The coordination buffer 402 can receive (e.g., asynchronously) the read data (dar <127: 0>) from the local memory array through the access bus and identify a set of received data as a single grouping of the read data (e.g., a 128-bit set). The coordination buffer 402 can output a coordinated output 412 (e.g., the read data that was temporarily held/buffered, "dar 2_ext") according to a clock-based timing signal ("stb_dar_clk"). Details regarding the clock-based timing signal are described below.

The second access control circuit 400 can also include an internal-bus access circuit 404 in each of the dies. The internal-bus access circuit 404 can be between the coordination buffer 402 and the die-external connectors 206. The internal-bus access circuit 404 can be configured to output the communicated data and/or the associated clock-based timing signal onto the stack-internal bus 210 according to an external trigger/signal. For example, the internal-bus access circuit 404 can include a set of buffers (e.g., tri-state buffers) that output the read data and/or the clock-based timing data (e.g., stb_dar_clk) onto the stack-internal bus 210. The internal-bus access circuit 404 can be controlled by a die enable signal 416 ("ena_extdar"). The die enable signal 416 can correspond to the die targeted by the operation (e.g., a write destination or a read source). For example, the die enable signal 416 can control the internal-bus access circuit 404 on a particular die to communicate the read data to the stack-internal bus 210 when the read data is from the memory array within the particular die. In some embodiments, the die enable signal 416 can be generated by the master die 202 and communicated to the targeted dies. In other embodiments, the die enable signal 416 can be based on a command or a set of bits that are broadcasted to all dies and decoded within each die for a match.

The second access control circuit 400 can include a clock circuit 406 that generates the clock signal 372 commonly used by the dies within the die stack 200. The common clock signal 372 can be communicated through a corresponding connection within the stack-internal bus 210. The common clock signal 372 can be used to time operations, such as the read operation. For example, the common clock signal 372 can be used to time or initiate precharging, switching, and/or read out portions of the read operation. In some embodiments, the master die 202 can include the clock circuit 406; the master die 202 can generate and broadcast the clock signal 372 to the dies within the die stack 200.

The second access control circuit 400 can use the common clock signal 372 as a clock-based timing signal 418 ("stb_dar_dk"). In other words, the second access control circuit 400 can use a die-external signal to coordinate communication of information over the stack-internal bus 210. In some embodiments, the second access control circuit 400 can include a timing generator circuit (e.g, a driver, not shown) that generates the clock-based timing signal 418 based on the common clock signal 372.

For the example illustrated in FIG. 4A, the clock-based timing signal 418 can be provided to the coordination buffer 402 and/or the internal-bus access circuit 404 to coordinate transfer of the read data over the stack-internal bus 210. The clock-based timing signal 418 can function as a trigger for releasing the temporarily stored read data (e.g., the coordinated output 412) from the coordination buffer 402. In some embodiments, the coordination buffer 402 can count the transitions in the clock-based timing signal 418 and release the coordinated output 412 when the count reaches a predetermined threshold assigned for the corresponding die.

The clock-based timing signal 418 can also be provided as an input to the internal-bus access circuit 404. The clock-based timing signal 418 can be provided to the stack-internal bus 210 through the internal-bus access circuit 404 as described above and function as a strobe for the read data communicated over the stack-internal bus 210.

The circuit path associated with the common clock signal 372 can have increased robustness against variations across the dies to synchronize die operations. For example, the common clock signal 372 can have a shorter data path (e.g., in terms of a physical distance traveled by a signal and/or a quantity of components within the signal path) than the target-sourced timing connections (e.g., stb_dar connections) to prevent or reduce skew differences caused by PVT variations. By generating/using the common clock signal 372 as the clock-based timing signal 418 and coordinating the die-to-die communications using an external and more stable signal, the second access control circuit 400 can control/reduce timing variations in the die-to-die communications. In other words, the coordination buffer 402 and the internal-bus access circuit 404 operating and/or communicating the clock-based timing signal 418 reduces skews/variations in the communicated data at a destination (e.g., the master die 202 for read operations). Accordingly, the coordination buffer 402, the internal-bus access circuit 404, and/or the clock-based timing signal 418 can provide increased operating speed (e.g., higher clock rates) for the die stack 200 while maintaining or lowering errors or difficulties associated with die-to-die communication timing. By reducing the skews/variations, the coordination buffer 402, the internal-bus access circuit 404, and/or the clock-based timing signal 418 can further increase the length of the stack-internal bus 210, thereby increasing the quantity of dies within the die stack 200 (e.g., more than three slave dies). The coordination buffer 402, the internal-bus access circuit 404, and/or the clock-based timing signal 418 can control the die-to-die communications without die-specific predetermined delays that can further slow down the data communication and/or remain vulnerable to PVT variations.

The master die 202 can include the active/enabled external communication circuit as described above. The master die 202 can include the shared access bus 342 and the shared timing connection 344 that functions as a common path for the die-to-die communications. For example, the master die 202 can receive over the shared access bus 342 the coordinated output 412 (e.g., the read data) or portions thereof (e.g., as separated by the bus controller 316) from the stack-internal bus 210. The shared timing connection 344 can be used to receive the clock-based timing signal 418 (e.g., the clock-based read strobe). The clock-coordinated data and timing signal can be provided to and processed by the master I/O control circuit 302 as described above.

In some embodiments, the master I/O control circuit 302 can include a second FIFO buffer 454 instead of the FIFO buffer 354 of FIG. 3. The second FIFO buffer 454 can have a depth ($d_3$) that is different from (e.g., less than) the depth ($d_1$) of the FIFO buffer 354. For example, since the coordination buffer 402 locally buffers the read data at the sourcing die, the second FIFO buffer 454 can have less depth than designs without the coordination buffer 402. Further, the depth reduction can be enabled by the reduced skew/variations in the signals as described above.

Figure 4B:
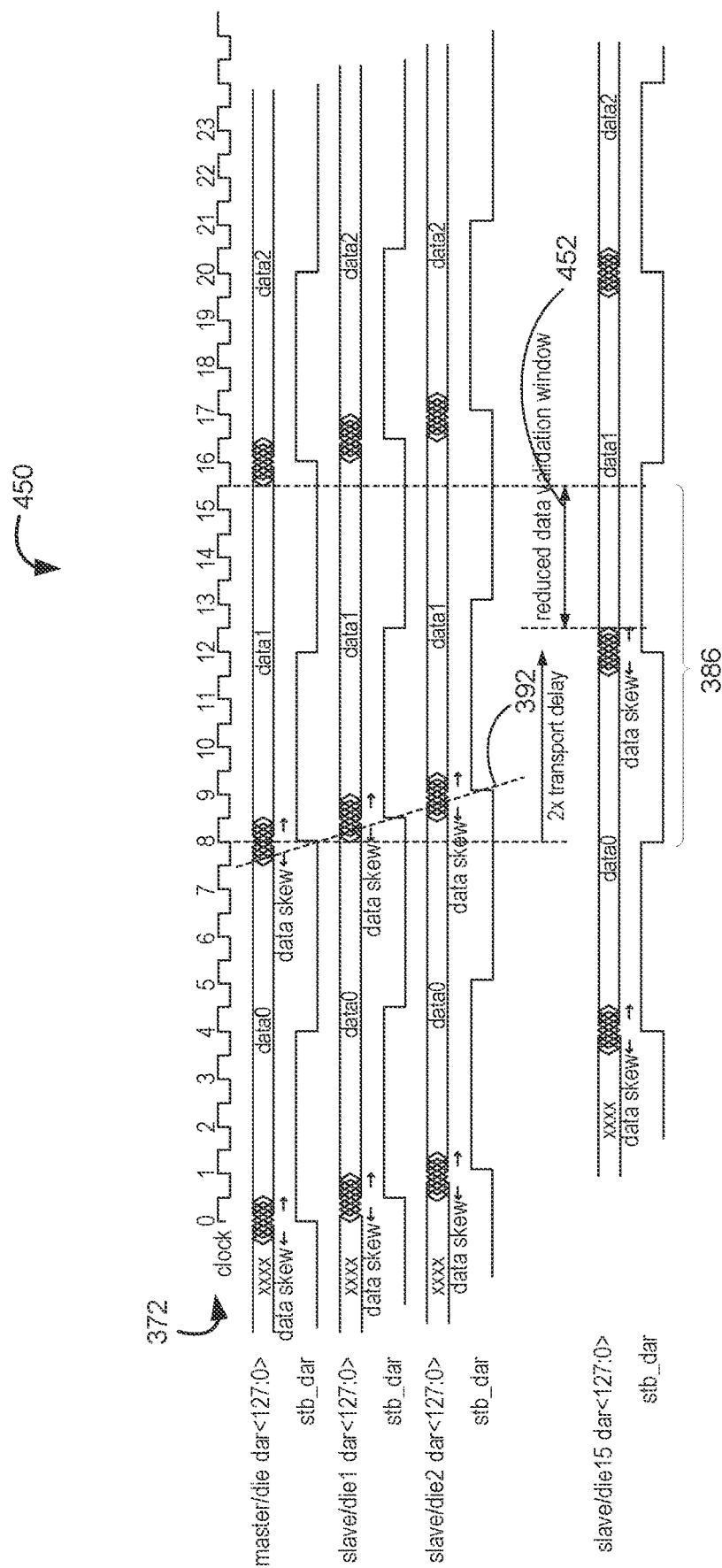
FIG. 4B is a timing diagram describing an example timing configuration for the second access control circuit of FIG. 4A in accordance with an embodiment of the present technology.

FIG. 4B is a timing diagram describing an example timing configuration 450 for the second access control circuit 400 of FIG. 4A in accordance with an embodiment of the present technology. The timing diagram can illustrate the read data received at the master die 202 of FIG. 2. As such, a timing for the read data from the memory array within the master die 202 can be a reference. Due to the transport delay 392, the read data from different dies arrive at the master die 202 with increasing delay. For example, the data from slave die 1 (e.g., first slave die, immediately adjacent to the master die 202) can arrive at the master die earlier than the data from slave die 15 (e.g., a 16th die in the stack with 14 slave dies between itself and the master die 202). However, since the read operations are communicated according to the clock signal 372, the delays can be predicted. As such, even accounting for twice the transport delay 392, the data valid windows 386 have a common overlap 452. Accordingly, data from any one of the dies are guaranteed to be accessible at the master die 202 during the common overlap 452.

Figure 4C:
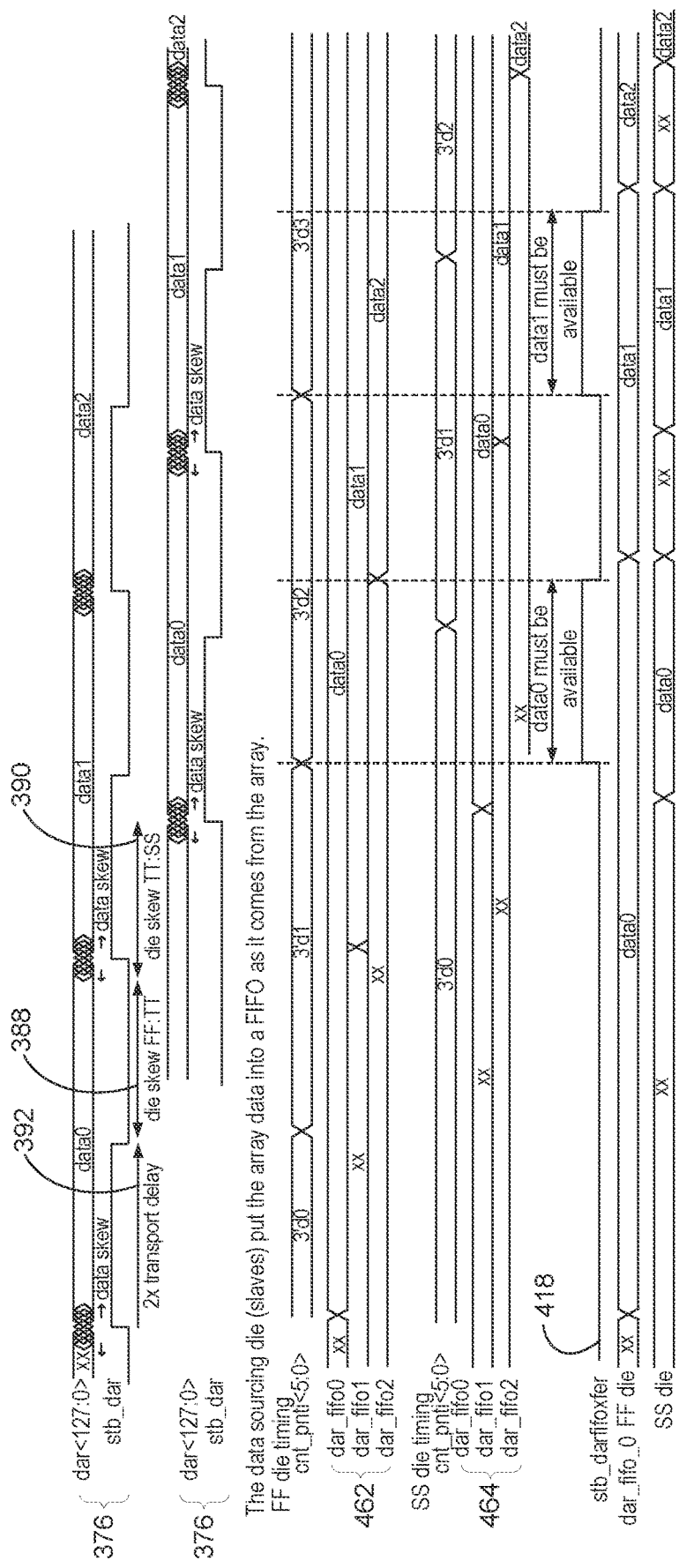
FIG. 4C is a timing diagram describing example operational states of the second access control circuit of FIG. 4A in accordance with an embodiment of the present technology.

FIG. 4C is a timing diagram describing example operational states of the second access control circuit 400 of FIG. 4A in accordance with an embodiment of the present technology. As an example, the FIG. 4C illustrates the fast die timing 376 and the slow die timing 378 for a worst-case scenario, such as when the fast die is the master die 202 of FIG. 2 and the slow die is the top die (e.g, die 15) in the die stack 200 of FIG. 2. Accordingly, the timing difference between the data from the fast and slow dies can correspond to double (e.g., for command to travel to source die and for the data to travel back to the master die) the transport delay 392, the forward skew 388, and the backward skew 390.

The second access control circuit 400 can account for the timing difference, even for the worst-case scenario, by temporarily storing the read data into the coordination buffer 402 of FIG. 4A and releasing/availing the read data according to the clock-based timing signal 418. As illustrated in FIG. 4C, the coordination buffer 402 of the fast/master die can temporarily store a first data set 462, and the coordination buffer 402 of the slow/top die can temporarily store a second data set 464.

The coordination buffer 402 can be configured to have a depth that accounts for the timing difference for the worst-case scenario. Accordingly, the coordination buffer 402 in the fast die can retain a first data (e.g., 'data0') long enough to overlap with a timing of the corresponding data in the slow die, while also storing subsequently produced read data (e.g., 'data1' and 'data2'). The temporarily stored data can be released according to the clock-based timing signal 418 that is based on or that directly corresponds to the clock signal 372 of FIG. 3B. For example, different coordination buffers 402 can be configured to count the clock cycles and release the data when the count reaches a predetermined threshold that represents the internal and/or the external skews for the corresponding die. In other words, the coordination buffer 402 can be configured to send the data out at a time that accounts for the transport delay 392, the forward skew 388, and/or the backward skew 390 for the corresponding die. Thus, the required data (e.g., 'data0') can be sent such that it arrives at the master die 202 within a predicted window.

Figure 5:
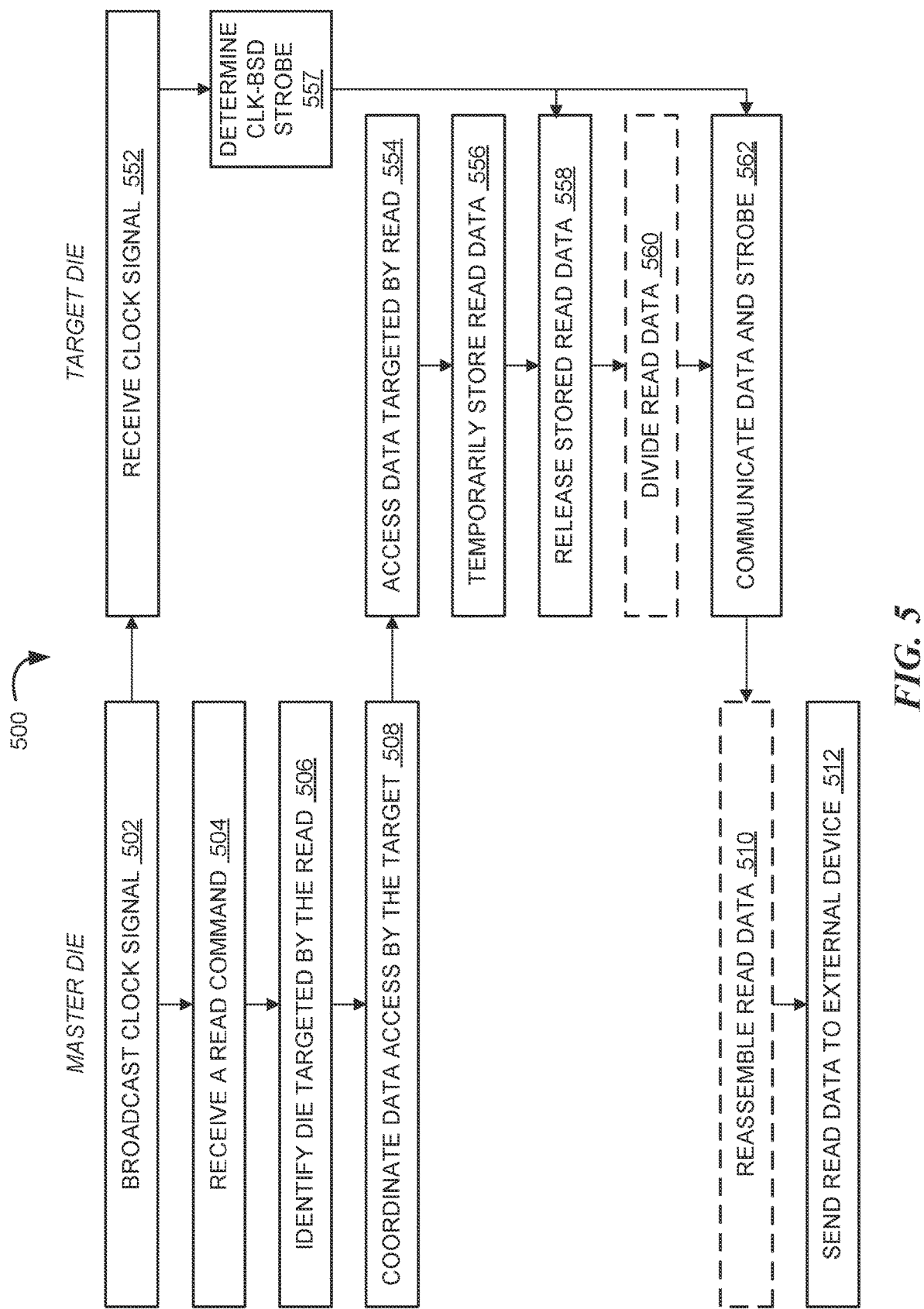
FIG. 5 is a flow diagram illustrating an example method of operating an apparatus in accordance with an embodiment of the present technology.

FIG. 5 is a flow diagram illustrating an example method 500 of operating an apparatus (e.g., the apparatus 100 of FIG. 1, the die stack 200 of FIG. 2, the first access control circuit 300 of FIG. 3, and/or the second access control circuit 400) in accordance with an embodiment of the present technology. For example, the method 500 can be for communicating the read data between the slave dies 204 of FIG. 2 and the master die 202 of FIG. 2 for a read operation as described above.

At block 502, the master die 202 can generate and broadcast clock signal. The master die 202 can use the clock circuit 406 to generate the clock signal. The master die 202 can provide the clock signal to the stack-internal bus 210 of FIG. 4A for the broadcast. Accordingly, at block 552, the dies in the die stack 200 can receive the broadcasted clock signal.

At block 504, the master die 202 can receive an operation command, such as a read command, from an external device (e.g., a host device). The master die 202 can receive the operation command through the stack-external connectors 208 of FIG. 2 and/or the master I/O circuit 212. The master die 202 can further receive information associated with the commanded operation, such as a read address.

At block 506, the master die 202 can identify one of the dies that is targeted by the received operation command. The master die 202 can identify the targeted die based on the received information. For example, the master die 202 (via, e.g., the master I/O circuit 212) can identify itself or one of the slave dies 204 as a targeted die that includes a storage location corresponding to the read address. At block 508, the master die 202 can coordinate data access by the targeted die. For example, the master die 202 can coordinate by notifying the targeted die of the command and the requested storage location and/or by broadcasting/sending the die enable signal 416 of FIG. 4A.

At block 554, the targeted die (e.g., the master die 202 or one of the slave dies 204) can access the locally stored data targeted by the read operation. The targeted die can access or read the data from a memory array local to/within the targeted die. The targeted die can access the requested data according to the coordination by the master die 202. The targeted die can provide the read data to the access bus (e.g., the slave access bus 312 of FIG. 3A/4A and/or the master access bus 332 of FIG. 3A/4A) for subsequent processing.

At block 556, the targeted die can temporarily store the read data in the coordination buffer 402 of FIG. 2. The read data can be loaded into the coordination buffer 402 in the targeted die through the corresponding access bus. The coordination buffer 402 can latch or identify an information set (e.g., a set of bits) that correspond to the read operation according to a die-internal timing signal ("stb_dar").

At block 557, the targeted die can determine a clock-based timing signal (e.g., the clock-based timing signal 418 of FIG. 4A). For example, the targeted die can generate a clock-based read strobe ("stb_dar_clk") based on the clock signal as described above.

At block 558, the targeted die can operate the coordination buffer 402 to release the read data (e.g., the coordinated output 412 of FIG. 4A) for communication to the master die 202. The coordination buffer 402 can release the read die according to the clock-based timing signal (i.e., instead of the die-internal timing signal) as described above.

At block 560, the targeted die can divide the read data into a sequence of portions (e.g, subsets of parallel bits). For example, the bus controller 316 of FIG. 4A can divide the read data into N number of portions that each include X number of bits or less and iteratively communicate the portions as described above. The communicated portions can be provided to the internal-bus access circuit 404 of FIG. 4A.

At block 562, the targeted die can communicate the read data (e.g., in portions or in whole) and the clock-based timing signal to the stack-internal bus 210. For example, the internal-bus access circuit 404 can provide the coordinated output 412 and the clock-based timing signal 418 to the stack-internal bus 210 as described above.

The coordinated output 412 and the clock-based timing signal 418 can be communicated to the master die 202 over the stack-internal bus 210. Accordingly, the master die 202 can receive the coordinated output 412 and the clock-based timing signal 418 through the stack-internal bus 210.

At block 510, the master die 202 can reassemble the received read data. For example, the traffic control circuit 351 of FIG. 4A can rearrange the separately communicated bits into a parallel set of bits as described above. At block 512, the master die 202 can further process the read data according to the die-external timing signal. For example, the master die 202 can temporarily store the read data in the FIFO buffer 454 of FIG. 4A, rearrange the parallel set of data into a serial stream of data using the serializer 356 of FIG. 4A, and/or transmit the serial stream of data to the external device through the external I/O controller 358 of FIG. 4A and the I/O pad 360 of FIG. 4A as described above.

Figure 6:
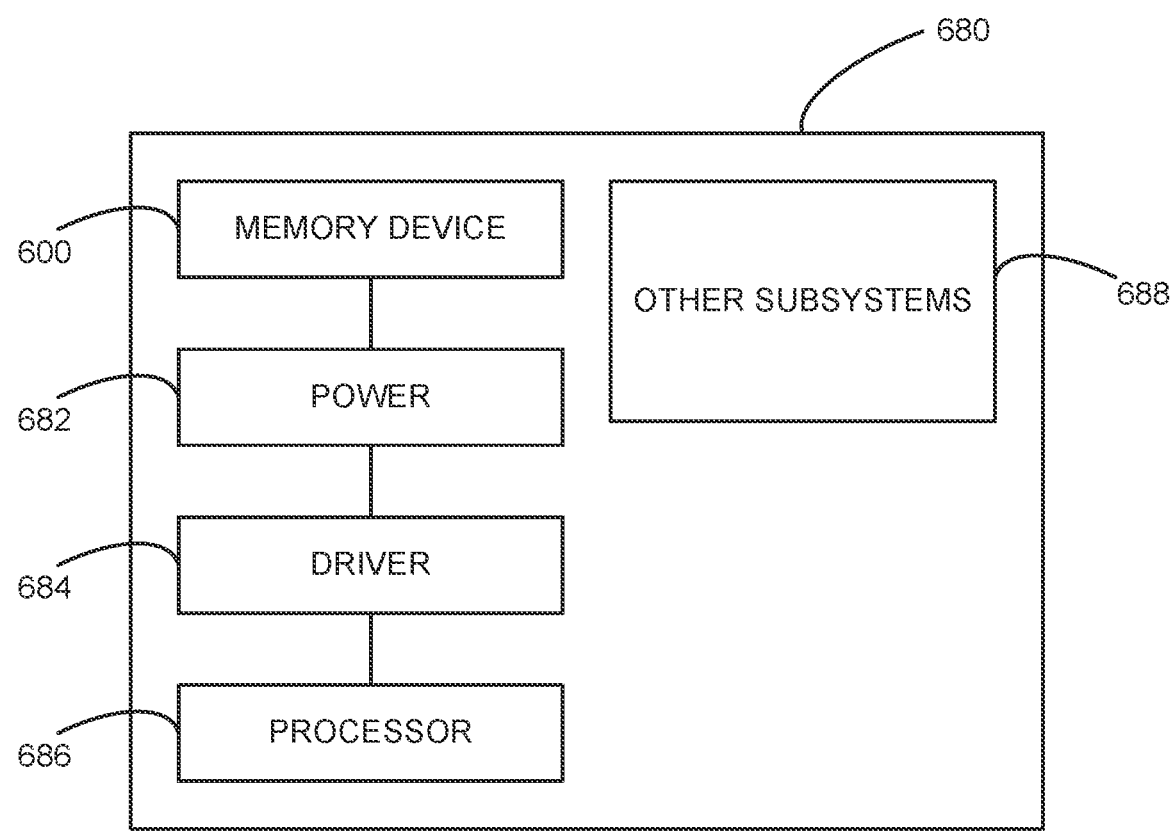
FIG. 6 is a schematic view of a system that includes an apparatus in accordance with an embodiment of the present technology.

FIG. 6 is a schematic view of a system that includes an apparatus in accordance with embodiments of the present technology. Any one of the foregoing apparatuses (e.g., memory devices) described above with reference to FIGS. 1-5 can be incorporated into any of a myriad of larger and/or more complex systems, a representative example of which is system 680 shown schematically in FIG. 6. The system 680 can include a memory device 600, a power source 682, a driver 684, a processor 686, and/or other subsystems or components 688. The memory device 600 can include features generally similar to those of the apparatus described above with reference to FIGS. 1-5, and can therefore include various features for performing a direct read request from a host device. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 680 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-6.

What is claimed is:

1. An apparatus, comprising:
an external interface die including an interfacing circuit;
at least one die stacked with and electrically coupled to the external interface die;
an interface bus electrically coupling the interfacing circuit of the external interface die and the at least one stacked die for communicating between the external interface die and the at least one stacked die;
the at least one stacked die configured to communicate with the external interface die,
wherein the at least one stacked die is configured to:
temporarily store data in a coordination buffer in communicating the data between endpoints, and
communicate the temporarily stored data from the coordination buffer through the interface bus to the interfacing circuit within the external interface die according to an externally-generated timing signal, wherein the externally-generated timing signal is a clock signal received through the interface bus; and
the interfacing circuit configured to communicate the temporarily stored data to an external device.

2. The apparatus of claim 1, wherein:
the external interface die and the at least one stacked die comprise a die stack; and
the external interface die is a master die for the die stack.

3. An apparatus, comprising:
an external interface die including an interfacing circuit;
at least one die stacked with and electrically coupled to the external interface die;
an interface bus electrically coupling the interfacing circuit of the external interface die and the at least one stacked die for communicating between the external interface die and the at least one stacked die;
the at least one stacked die configured to communicate with the external interface die,
wherein the at least one stacked die is configured to:
temporarily store data in communicating the data between endpoints, and
communicate the temporarily stored data through the interface bus to the interfacing circuit according to an externally-generated timing signal, wherein the externally-generated timing signal is received through the interface bus; and
wherein the at least one stacked die includes an internal-bus access circuit and a coordination buffer that are configured together to coordinate the communication of read data according to the externally-generated timing signal; and
the interfacing circuit configured to communicate the temporarily stored data to an external device.

4. The apparatus of claim 3, wherein the coordination buffer is configured to temporarily store the read data in communicating between endpoints.

5. The apparatus of claim 4, wherein:
the externally-generated timing signal is a clock signal generated by the external interface die and broadcasted over the interface bus;
the external interface die and the at least one stacked die each include a local memory array configured to provide storage of the data as an endpoint;
the data communication is for a read operation to provide the external device with the read data stored at the endpoint in the at least one stacked die, wherein the provide data is the read data that is temporarily stored and then communicated between the external interface die and the at least one stacked die;
the coordination buffer in the at least one stacked die is configured to:
receive the read data from a local memory array internal to the at least one stacked die, wherein the temporarily stored data is the read data from the memory array;
temporarily store the read data according to a die-internal read strobe, and
communicate the read data to the interface bus according to the clock signal;
the interface bus is configured to communicate the read data and the externally-generated clock signal between the external interface die and the at least one stacked die; and
the external interface die is configured to provide the read data from the at least one stacked die to the external device.

6. The apparatus of claim 5, wherein:
the coordination buffer is configured to utilize a clock-based read strobe in communicating the read data to the interface bus, wherein the clock-based read strobe is based on the clock signal;
the at least one stacked die includes an internal-bus access circuit configured to:
receive the read data from the coordination buffer;
receive the clock-based read strobe;
communicate the read data and the clock-based read strobe to the interface bus; and
the interface bus is configured to communicate the clock-based read strobe, in addition to
the clock signal, between the external interface die and the at least one stacked die.

7. The apparatus of claim 6, wherein:
the external interface die includes circuitry configured to generate a die enable signal configured to identify the at least one stacked die having stored thereon the read data requested by the read operation; and
internal-bus access circuit includes:
a first set of buffers configured to control communication of the read data; and
a second set of buffers configured to control communication of the clock-based read strobe, wherein the first and second sets of buffers are enabled according to the die enable signal.

8. The apparatus of claim 3, wherein:
the interface bus includes X number of parallel connections configured to communicate the read data; and
the stacked die includes a bus controller configured to:
divide the read data into N number of portions that each include X number of bits or less, and
iteratively provide the N number of portions to the interface bus, wherein the bits in each portion are provided in parallel.

9. The apparatus of claim 3, wherein the at least one stacked die comprises a die stack that includes four or more dies electrically coupled to the external interface die, each of the four or more dies including a local instance of the coordination buffer.

10. An apparatus, comprising:
an external interface die;
at least one die stacked with and electrically coupled to the external interface die, the at least one stacked die configured to communicate with the external interface die, wherein the at least one stacked die is configured to:
temporarily store data in communicating the data between endpoints, and
communicate the temporarily stored data according to an externally-generated timing signal, wherein the externally-generated timing signal is a clock signal; and
an interface bus electrically coupling the external interface die and the stacked die for communicating the temporarily stored data between the external interface die and the at least one stacked die;
wherein
the data communication is for a read operation to provide an external device with the data stored in the external interface die;
the external interface die includes:
a memory array configured to store the data locally on the external interface die;
a coordination buffer configured to:
receive read data from the memory array internal to the external interface die;
temporarily store the read data according to a die-internal read strobe, and release the read data to the interface bus according to a clock-based read strobe in communicating the read data to the interface bus, wherein the clock-based read strobe is based on the externally-generated timing signal;
an internal-bus access circuit configured to:
receive the read data from the coordination buffer;
receive the clock-based read strobe;
communicate the read data and the clock-based read strobe to the interface bus; and
a master interface control circuit configured to:
receive the read data from the local memory array through the interface bus;
process and send the read data to the external device for the read operation; and
the interface bus is configured to communicate the clock-based read strobe, in addition to a clock signal, between the external interface die and the at least one stacked die.

11. The apparatus of claim 10, wherein the master interface control circuit includes a serializer configured to:
receive the read data as a parallel set of bits; and
serially communicate the parallel set of bits as a single stream of bits intended for external communication.

12. The apparatus of claim 11, wherein the master interface control circuit includes an output buffer electrically coupled to and located between the interface bus and the serializer, the output buffer configured to temporarily store the read data before and/or during serialization according to a depth that corresponds to a depth of the coordination buffer and/or the second coordination buffer.

13. A semiconductor memory device, comprising:
at least one die that includes:
a memory array configured to locally store data;
a first interface circuit configured to coordinate stack-internal communications;
an interface die forming a die stack with the at least one die, the interface die including:
an interface memory array configured to store data locally on the interface die;
a second interface circuit configured to:
provide a clock signal used to synchronize the interface die and the at least one die, and
coordinate the stack-internal communications along with external communication of read data stored at or designated for storage within the die stack according to the clock signal; and
stack-internal connectors connecting the at least one die and the interface die and configured to function as a stack-internal bus, the stack-internal bus configured to communicate the read data, the clock signal, and the clock-based read strobe between the electrically coupled dies.

14. The semiconductor memory device of claim 13, wherein the stack-internal connectors are configured to couple the at least one die and the interface die in parallel.

15. The semiconductor memory device of claim 13, wherein each of the at least one die and the interface die includes a First-In First-Out (FIF) buffer configured to:
temporarily store read data from the corresponding on-board memory array;
release the read data according to a clock-based read strobe that is based on a timing signal generated by a source external to the set of slave dies.

16. The semiconductor memory device of claim 13, wherein each of the at least one die and the interface die includes an output circuit configured to transmit the read data to an external device, wherein the output circuit in the dies in the set of slave dies are disabled.

17. A method of operating an apparatus, the method comprising:
internally communicate a clock signal between dies within a die stack using a stack-internal bus;
reading data from a memory array within the die stack;
providing the read data to the stack-internal bus according to a timing signal that directly corresponds to the clock signal;
receiving the read data and a die-external timing signal at an interfacing die through the stack-internal bus, wherein the memory array providing the read data is the interfacing die, wherein the read data stored in the interfacing die is communicated through the stack-internal bus to an interface circuit within the interfacing die; and processing the read data at the interfacing die according to the die-external timing signal for transmission from the interfacing die to an external device.

18. The method of claim 17, wherein the clock signal is from the interfacing die.

19. The method of claim 17, wherein the memory array comprises a target die within the die stack, the method further comprising:

at the target die, dividing the read data into N number of portions that each include X number of bits or less;

iteratively providing the N number of portions to the stack-internal bus, wherein the bits in each portion are provided in parallel; and at the interfacing die, reassembling the read data from the separately communicated portions, wherein the read data is assembled at an output buffer according to the die-external timing signal.

\* \* \* \* \*